Nov. 30, 1965 W. C. SMITH 3,220,095

METHOD FOR FORMING ENCLOSURES FOR SEMICONDUCTOR DEVICES

Filed Dec. 15, 1960

INVENTOR.
WILLIAM C. SMITH
BY
Clarence R. Patty, Jr.
ATTORNEY

United States Patent Office 3,220,095
Patented Nov. 30, 1965

3,220,095

METHOD FOR FORMING ENCLOSURES FOR SEMICONDUCTOR DEVICES

William C. Smith, Corning, N.Y., assignor to Corning Glass Works, Corning, N.Y., a corporation of New York Filed Dec. 15, 1960, Ser. No. 76,046
6 Claims. (Cl. 29—155.5)

The present invention relates to semiconductor devices and more particularly to an improved method for assembling such devices and to the improved devices produced thereby.

Semiconductor devices, such as transistors and diodes, comprise generally three parts. These are a semiconductor element, or crystal, a plurality of conducting leads attached thereto and a protective housing enclosing the crystal, the conducting leads passing through the housing and being hermetically sealed thereto.

The desirability of forming the housings of semiconductor devices from ceramic materials, which term is herein employed to refer to materials of either vitreous or crystalline nature, has been recognized in the past. However, since high temperatures are required to melt such ceramic materials in order to effect satisfactory seals, and since such temperatures are harmful to the crystals employed, the successful fabrication of such devices has been difficult. It has heretofore been found necessary to construct such devices with separations between their crystals and their sealing areas greater than were otherwise required, with the consequence that such devices were larger than were otherwise necessary or desirable.

It is, accordingly, an object of the present invention to provide a method for the manufacture of semiconductor devices with ceramic housings whereby such devices may be constructed of smaller size and more convenient shape than have heretofore been obtainable and wherein the danger of thermal damage to the crystal is minimized.

The method of the present invention comprises in general the steps of forming a ceramic housing in two parts, sealing conducting leads through the walls of one of said parts, subsequently securing a crystal to the leads and then joining the two parts of the housing to enclose the crystal therein.

The method may be best understood by reference to the accompanying drawings illustrating the steps employed to form a transistor according to the present invention, wherein.

Figure 1:
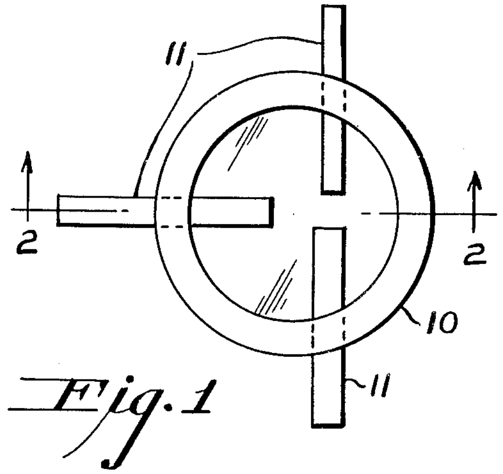
FIG. 1 is a top view of a base member used in constructing a transistor according to the present invention with the conducting leads sealed in place.
Figure 2:
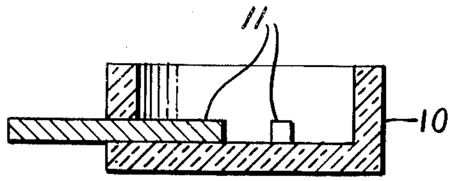
FIG. 2 is a view taken on line 2—2 of FIG. 1.
Figure 3:
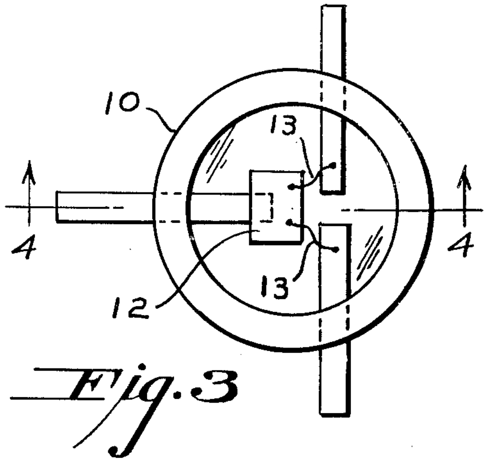
FIG. 3 is the view of the base member of FIG. 1 with the addition of the crystal.
Figure 4:
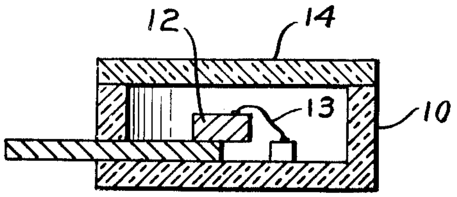
FIG. 4 is a view taken on line 4—4 of FIG. 3 with the addition of a ceramic cover to the base member.

According to the present invention there is formed a cup-shaped base 10 with the plurality of leads 11 hermetically sealed therein as illustrated in FIGS. 1 and 2. Although this combination of base and leads may be formed by various well-known methods, the present applicant has found that such may be conveniently formed by pressing finely ground or powdered ceramic material into the desired shape about the leads and firing the resulting object in order simultaneously to form the material into a single mass and to seal the leads therein. Next, solder glass or other appropriate ceramic material having a melting point lower than that of the ceramic material of base member 10 is applied along the upper rim of base member 10, and heat is applied to fuse the solder glass to the base member. Subsequently, crystal 12 is secured to leads 11 as shown in FIGS. 3 and 4 by welding, soldering or any other appropriate technique. Lead extensions 13 aid in effecting contact at the precise points desired but are not essential to the invention. Next, ceramic cover 14 is placed over base member 10 and sealed thereto. Although the final seal between base 10 and cover 14 may be effected by the localized application of heat along the juncture between the two parts by various well-known techniques, the applicant has found it advantageous to employ the electric arc sealing method described in U.S. Patent 2,306,054, issued to E. M. Guyer.

In constructing semiconductor devices having ceramic housings it has heretofore been common to effect the seal between the leads and the housing after attaching the crystal to the leads, thereby permitting the conduction of heat from the area of seal through the leads to the crystal. One advantage of the present method is that the crystal is not attached to the leads until after they have been sealed to the housing. The only heat which is applied after the crystal is in place is applied in an area spaced from the metallic leads. The crystal and leads are placed near or at the bottom of the base member of the housing in order to keep them as far separated from the area of final application of heat as is practicable.

Transistors can be constructed according to the method of the present invention having outside diameters of less than .165 inch and heights of less than .060 inch.

Figure 5:
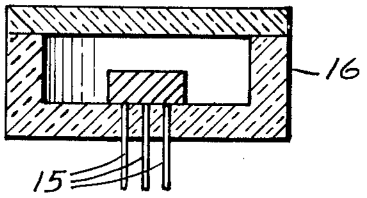
FIG. 5 is a vertical sectional view of an alternative form of transistor constructed according to the present invention.

One of the advantages of the semiconductor device illustrated in FIGS. 1–4 is its thinness, which permits convenient inclusion in printed circuit boards. If, however, thinness is not necessary, such device may be in the final form illustrated in sectional view in FIG. 5, having its leads 15 emerging from the bottom surface of its base member 16. Here an advantage results from the even greater separation between the leads and the area of final seal than is found in the embodiment illustrated in FIGS. 1–4.

It is to be understood that semiconductor devices can be constructed according to the method of the present invention having various shapes depending upon the uses for which they are intended and that the present invention is not to be limited thereby but rather by the novel method of manufacture as defined by the scope of the appended claims.

What is claimed is:

1. The method of manufacturing a semiconductor device which comprises the steps of forming a base member by pressing a quantity of finely divided ceramic material about a plurality of conducting leads passing through said material, heating said material to form said material into a single mass and to seal said leads therein, subsequently attaching a semiconductor element to said leads and sealing a cover on said base member to enclose said semiconductor element.

2. The method of manufacturing a semiconductor device which comprises the steps of forming from a ceramic material a base member having walls defining a cavity with an opening for receiving a semiconductor element, sealing through said walls at locations remote from said opening a plurality of conducting leads each having a terminus in said cavity, applying to said base member about said opening a ceramic substance which is electrically conducting at a temperature lower than that at which said ceramic material comprising said base member becomes electrically conducting, attaching a semiconductor element to said termini of said leads, placing over said opening and in contact with said ceramic substance a cover comprising a ceramic material, heating said ceramic substance to said temperature at which it becomes electrically conducting, passing an electrical current through said ceramic substance further to elevate its temperature, and cooling said ceramic substance to seal together said base member and said cover.

3. The method of joining two ceramic bodies which comprises the steps of applying to a surface of at least one of said bodies a ceramic substance which is electrically conducting at a temperature lower than that at which either of said bodies becomes electrically conducting, bringing said substance into contact with a surface of the other said body, supplying heat to said substance to elevate the temperature of said substance to said temperature at which it is electrically conducting, passing an electrical current through said heated substance further to elevate its temperature, and cooling said substance to seal together said bodies.

4. The method of enclosing a semiconductor element which comprises the steps of forming from a ceramic material two housing components having complementary annular sealing edges, at least one of said components having a cavity for receiving said element, passing through said housing components a plurality of conducting leads, securing said semiconductor element to said leads, applying along at least one of said sealing edges a ceramic substance which softens at a temperature lower than that of either of said housing components, supplying heat to said ceramic substance to elevate its temperature to a temperature at which it becomes electrically conducting, passing an electrical current through said substance further to elevate its temperature, and cooling said substance to seal together said housing components.

5. The method of joining two bodies of ceramic material which comprises the steps of juxtaposing said bodies, interposing therebetween a ceramic substance which is electrically conducting at a temperature lower than that at which the juxtaposed surfaces of said bodies are electrically conducting, heating said substance to said temperature at which it is electrically conducting, passing an electrical current through said heated substance, and cooling said substance to seal together said bodies.

6. The method of manufacturing a semiconductor device which comprises the steps of forming a base member having walls defining a cavity within with an opening for receiving a semiconductor element by pressing a quantity of finely divided ceramic material about a plurality of conducting leads passing through said material, heating said material to form said material into a single mass and to seal said leads therein, applying to said base member about said opening a ceramic substance which is electrically conducting at a temperature lower than that at which said ceramic material comprising said base member becomes electrically conducting, attaching a semiconductor element to said leads, placing over said opening and in contact with said ceramic substance a cover comprising a ceramic material, heating said ceramic substance to a temperature at which it becomes electrically conducting, passing an electrical current through said ceramic substance further to elevate its temperature, and cooling said ceramic substance to seal together said base member and said cover.

References Cited by the Examiner

UNITED STATES PATENTS

| | | | |
|---|---|---|---|
| 2,089,541 | 8/1937 | Dallenbach | 174—152 |
| 2,235,504 | 3/1941 | Rennie | 264—61 X |
| 2,306,054 | 12/1942 | Guyer | 65—40 |
| 2,568,881 | 9/1951 | Albers-Schoenberg | 18—59 X |
| 2,735,162 | 2/1956 | Huck | 264—61 X |
| 2,817,046 | 12/1957 | Weiss | 65—40 X |
| 2,830,238 | 4/1958 | Gudmundsen | 317—234 |
| 2,880,383 | 3/1959 | Taylor | 29—25.3 X |
| 2,937,410 | 5/1960 | Davies et al. | 264—259 |
| 2,971,138 | 2/1961 | Meisel et al. | 29—25.3 X |
| 3,006,984 | 10/1961 | Bol et al. | 174—151 |

JOHN W. HUCKERT, *Primary Examiner.*

THOMAS E. BEALL, JAMES D. KALLAM, DAVID J. GALVIN, *Examiners.*